(12) United States Patent
Baratam

(10) Patent No.: US 9,306,545 B2
(45) Date of Patent: Apr. 5, 2016

(54) MASTER-SLAVE FLIP-FLOP CIRCUIT AND METHOD OF OPERATING THE MASTER-SLAVE FLIP-FLOP CIRCUIT

(71) Applicant: ARM LIMITED, Cambridge (GB)

(72) Inventor: Anil Kumar Baratam, Bangalore (IN)

(73) Assignee: ARM Limited, Cambridge (GB)

( * ) Notice: Subject to any disclaimer, the term of this patent is extended or adjusted under 35 U.S.C. 154(b) by 151 days.

(21) Appl. No.: 14/154,757

(22) Filed: Jan. 14, 2014

(65) Prior Publication Data

US 2015/0200651 A1 Jul. 16, 2015

(51) Int. Cl.
*H03K 3/289* (2006.01)
*H03K 3/012* (2006.01)
*H03K 3/3562* (2006.01)

(52) U.S. Cl.
CPC ............ *H03K 3/012* (2013.01); *H03K 3/35625* (2013.01)

(58) Field of Classification Search
CPC .............. H03K 3/35625; H03K 3/012; G01R 31/318552; G06F 1/10
See application file for complete search history.

(56) References Cited

U.S. PATENT DOCUMENTS

| 6,630,853 B1* | 10/2003 | Hamada ........................ 327/202 |
| 7,772,906 B2 | 8/2010 | Naffziger | |
| 2008/0218233 A1* | 9/2008 | Yamamoto et al. ........... 327/198 |
| 2013/0042158 A1* | 2/2013 | Hsieh et al. .................... 714/726 |

OTHER PUBLICATIONS

Stojanovic et al., "Comparative Analysis of Master—Slave Latches and Flip-Flops for High-Performance and Low-Power Systems", Solid-State Circuits, IEEE Journal of, vol. 34, No. 4, Apr. 1999, pp. 536-548.
Strollo et al., "Low Power Flip-Flop with Clock Gating on Master and Slave Latches", Electronics Letters, vol. 36, No. 4, Feb. 2000, 2 pages.
Strollo et al., "New Clock-Gating Techniques for Low-Power Flip-Flops", Proceedings of the 200 International Symposium on Low Power Electronics and Design, ACM, 2000, pp. 114-119.
Hirata et al., "The Cross Charge-Control Flip-Flop: A Low Power and High-Speed Flip-Flop Suitable for Mobile Application SoCs", VLSI Circuits, 2005 Digest of Technical Papers, 2005 Symposium on IEEE, 2005.
Wang et al., "Structural Tests of Slave Clock Gating in Low-Power Flip-Flop", VLSI Test Symposium (VTS), 2011, IEEE 29$^{th}$, IEEE, 2011.

* cited by examiner

*Primary Examiner* — Sibin Chen
(74) *Attorney, Agent, or Firm* — Pramudji Law Group PLLC; Ari Pramudji

(57) ABSTRACT

A master-slave flip-flop circuit with a master latch and slave latch has clock generating circuitry which generates a gated clock signal based on the clock signal and a gating control signal. When the gating control signal has a first value, then the gated clock signal has a value dependent on the clock signal, while when the gating control signal has a second value then the gated clock signal has a fixed value independent of the clock signal. At least one component of the master-slave flip-flop circuit is controlled by the gated clock signal so that dynamic switching power can be reduced. The gating control signal is dependent on the input signal or a signal within the master latch and is independent of a slave signal in the slave latch and the output signal of the flip-flop.

20 Claims, 14 Drawing Sheets

PPA comparison

| Parameter | existing | new topology | % diff |
|---|---|---|---|
| Pavg00 | 0.74 | 0.62 | -17% |
| Pavg01 | 1.05 | 1.07 | 2% |
| Pavg10 | 1.01 | 0.83 | -18% |
| Pavg11 | 0.78 | 0.82 | 5% |
| Pclock (i/p pincap) | 0.18 | 0.18 | 0% |
| Pdata (i/p pincap) | 0.02 | 0.02 | 0% |

*All parameters are normalized

- Total cell power

Equation for power
= $a_{00}P_{00} + a_{01}P_{01} + a_{11}P_{11} + a_{10}P_{10} + P_{data} + P_{clock}$ $a_{00}$ $a_{01}$ $a_{11}$ $a_{10}$ are corresponding event probabilities

| S.No | Condition | a00 | a01 | a10 | a11 | existing | new topology | % diff |
|---|---|---|---|---|---|---|---|---|
| 1 | stable0 | 0.8 | 0.1 | 0.1 | 0 | 1.00 | 0.89 | -11% |
| 2 | Low activity rate | 0.4 | 0.1 | 0.1 | 0.4 | 1.01 | 0.96 | -5% |
| 3 | High activity rate | 0 | 0.5 | 0.5 | 0 | 1.23 | 1.15 | -7% |
| 4 | Equiprobable | 0.25 | 0.25 | 0.25 | 0.25 | 1.10 | 1.03 | -6% |

FIG. 10

MASTER-SLAVE FLIP-FLOP CIRCUIT AND METHOD OF OPERATING THE MASTER-SLAVE FLIP-FLOP CIRCUIT

FIELD OF THE INVENTION

The present technique relates to the field of integrated circuits. More particularly, the present technique relates to a master-slave flip-flop circuit.

BACKGROUND OF THE INVENTION

Integrated circuits often include flip-flops for storing state within the circuit. A master-slave flip-flop circuit may include a master latch which stores a master signal which is dependent on an input signal to the flip-flop, and a slave latch which stores a slave signal which switches in dependence on the master signal in the master latch. The output of the flip-flop is dependent on the slave signal. The master latch and slave latch are clocked so that the master latch captures its master signal in a first phase of a clock signal and the slave latch captures its slave signal in a second phase of the clock signal. It is desirable to reduce the amount of power consumed by the master-slave flip-flop circuit.

SUMMARY OF THE INVENTION

Viewed from one aspect, the present technique provides a master-slave flip-flop circuit for generating an output signal in response to an input signal and a clock signal, the master-slave flip-flop circuit comprising:

a master latch configured to capture a master signal dependent on the input signal during a first phase of the clock signal and to retain the master signal during a second phase of the clock signal;

a slave latch configured to capture a slave signal dependent on the master signal during the second phase of the clock signal and to retain the slave signal during the first phase of the clock signal, wherein the output signal is dependent on the slave signal; and clock generating circuitry configured to generate a gated clock signal based on the clock signal and a gating control signal;

wherein the clock generating circuitry is configured to generate the gated clock signal with a value dependent on the clock signal when the gating control signal has a first value, and to generate the gated clock signal with a fixed value independent of the clock signal when the gating control signal has a second value;

the master-slave flip-flop circuit comprises at least one clocked component controlled by the gated clock signal; and the gating control signal is dependent on the input signal or a signal at a signal node of the master latch, and is independent of the slave signal and the output signal.

The master-slave flip-flop circuit has clock generating circuitry which generates a gated clock signal based on the clock signal and a gating control signal. When the gating control signal has a first value, the gated clock signal has a value dependent on the clock signal, while when the gating control signal has a second value then the gated clock signal is generated with a fixed value independent of the clock signal. At least one component of the master-slave flip-flop circuit is clocked by the gated clock signal. Hence, when the gating control signal has the second value then the at least one clocked component does not switch states and so dynamic switching leakage is reduced to save power.

Unlike a previous approach in which the gating control signal is dependent on both the input signal and the output signal of the master-slave flip-flop circuit, in order to detect when the flip-flop remains in a stable state, in the present technique the gating control signal is dependent on the input signal or a signal at a node of the master latch, but independent of the slave signal and the output signal. This provides a simpler circuit arrangement for the clock generating circuitry, which incurs less static leakage, because it is not necessary to provide combinational logic for comparing the input and output signals. That is, the present technique recognises that is not necessary to consider whether the input and the output signals of the flip-flop are the same in order to determine whether some components can be clock gated. Even when the flip-flop is changing state with the input signal different to the output signal, it is recognised that when the gating control signal has the second value, there are some clocked components within the flip-flop which can be held at a fixed state without affecting the correct operation of the flip-flop. Hence, the complexity of the clock generating circuitry can be reduced compared to the previous approach, while overall power consumption is reduced.

In general, the gating control signal is dependent on the input signal or a signal at the signal node of the master latch. More particularly, the gating control signal may actually comprise the input signal or the signal at the signal node of the master latch. In other embodiments, the gating control signal may comprise a signal derived from the input signal or a signal at a signal node of the master latch, such as a buffered version of the input signal or master latch signal.

The gated clock signal may be generated in various ways. In one embodiment, the clock generating circuitry may generate an inverted clock signal from the clock signal, and then the gated clock signal may be generated based on the inverted clock signal. In this case, then the inverted clock signal and the gated clock signal may be used to clock components of master flip-flop. The gated clock signal may be an inverted version of the inverted clock signal when the gating control signal has the first value. By clocking components of the flip-flop based on the inverted clock signal and the gated clock signal, this approach achieves improved performance compared to implementations which directly gate the original clock signal and use only the original clock signal and gated clock signal to clock the flip-flop components, because the inverted clock signal and gated clock signal are generated locally by the clock generating circuitry, whereas the original clock signal is often a weaker signal because of losses incurred when routing the original clock signal across an integrated circuit to the flip-flop (e.g. via a clock distribution tree).

The clock generating circuitry may have a logic gate which receives as inputs the inverted clock signal and the gating control signal, and outputs the gated clock signal. For example, the logic gate may be a NOR gate, so that the gated clock signal corresponds to the inverted clock signal NORed with the gating control signal. In another example, the logic gate may be a NAND gate.

The master latch may comprise a first master node which is coupled to an input stage for inputting a signal dependent on the input signal, and a second master node which is coupled to the slave stage. In one example, the gating control signal may comprise a signal at the first master node of the master latch. This is useful because, as will be discussed below, there may be several alternative input signals which can be selected by the input stage (such as a data signal and a scan input signal), and so by gating the clock signal based on the signal at the first master node, which may reflect whichever of the input signals is selected by the input stage, the power gating can be implemented regardless of which of the inputs is selected by the input stage. When the signal at the first master node is the gating control signal, then the first value of the gating control signal may be the logical low signal level (logical 0), and the second value of the gating control signal, which causes the gated clock signal to be clamped to the fixed value, may be the logical high signal level (logical 1).

The at least one clocked component which is clocked by the gated clock signal may include various parts of the flip-flop circuit. In one example, the at least one clocked component may comprise a transistor within the master latch. For example, the master latch may comprise first and second inverters, with the first inverter inverting the signal at the first master node to produce the signal at the second master node, and the second inverter inverting the signal at the second master node to produce the signal at the first master node (this arrangement enables the master latch to retain state). A transistor within the second inverter may be clocked by the gated clock signal. More particularly, this transistor may be within a pulldown portion of the second inverter for pulling the signal at the first master node down to a logical low signal level. When the signal at the first master node has the logical high signal level (second value of the control signal), then the pulldown portion of the second inverter is not required to be active, because it is the pullup portion of the second inverter which is pulling the first master node to the logical high signal level. Therefore, there is no need for the transistor within the pulldown portion to switch on and off in response to the clock signal, and by using the gated clock signal to clock this transistor then dynamic switching power consumption can be reduced.

Alternatively, or in addition to a transistor within the master latch, the at least one clocked component may include a transistor of an input stage which inputs a signal to the first master node of the master latch during the first phase of the clock signal and which isolates the first master node from changes in the input signal during the second phase of the clock signal. The signal input to the first master node by the input stage during the first phase may be an inverted version of the input signal. The input stage may have a pullup portion for pulling the signal at the first master node to a logical high level and a pulldown portion for pulling the signal at the first master node to a logical low signal level, and the at least one clocked component may include a transistor within the pullup portion of the input stage. When the gating control signal has the second value (first master node is logical high), then the second inverter within the master latch will already be pulling the second at the first master node high and so it is not essential for the pullup portion of the input stage to toggle between on and off states. Therefore, by using the gated clock signal to control a clocked transistor within the pullup portion of the input stage, dynamic switching leakage can be reduced without affecting the correct operation of the flip-flop.

The at least one clocked component may also comprise a transistor of the slave latch. For example, the slave latch may comprise a pair of inverters and the at least one clocked component may comprise a transistor within one of these inverters.

The input signal to the master-slave flip-flop circuit may have various forms. In some embodiments, only a data input signal may be provided to the master-slave flip-flop circuit, so the input signal may be the data input signal.

In other embodiments, there may be multiple input signals provided. For example, the input signal may be one of a data input signal and a scan input signal. A scan input is useful to allow testing of integrated circuits, so that a predetermined value defined by the scan input signal can be injected into the flip-flop to check whether the integrated circuit responds correctly to the scan input value. In contrast, the data input may be derived from another element of the circuit, which may be harder to set to a predetermined value. The input stage of the master-slave flip-flop circuit may receive the data input signal, the scan input signal and a scan enable signal, and may select which of the data input signal and the scan input signal should be used as the input signal for the flip-flop, based on whether the scan enable signal has a first value or a second value.

In some embodiments, the master and slave latches may also receive a set signal and/or a reset signal. In response to the set signal the master signal and slave signal may be set to a first and second predetermined value respectively, which typically would both represent logical 1, although it is possible to use other values. In response to the reset signal, the master and slave signals may be set to third and fourth predetermined values respectively, which typically would both represent logical 0, but could also be different values.

Viewed from a further aspect, the present technique provides a master-slave flip-flop circuit for generating an output signal in response to an input signal and a clock signal, the master-slave flip-flop circuit comprising:

master latch means for capturing a master signal dependent on the input signal during a first phase of the clock signal and for retaining the master signal during a second phase of the clock signal;

slave latch means for capturing a slave signal dependent on the master signal during the second phase of the clock signal and for retaining the slave signal during the first phase of the clock signal, wherein the output signal is dependent on the slave signal; and clock generating means for generating a gated clock signal based on the clock signal and a gating control signal;

wherein the clock generating means is configured to generate the gated clock signal with a value dependent on the clock signal when the gating control signal has a first value, and to generate the gated clock signal with a fixed value independent of the clock signal when the gating control signal has a second value;

the master-slave flip-flop circuit comprises at least one clocked component means for being controlled by the gated clock signal; and the gating control signal is dependent on the input signal or a signal at a signal node of the master latch means, and is independent of the slave signal and the output signal.

Viewed from a further aspect, the present technique provides a method of operating a master-slave flip-flop circuit for generating an output signal in response to an input signal and a clock signal, the method comprising:

during a first phase of the clock signal, capturing a master signal dependent on the input signal at a master latch;

during a second phase of the clock signal, retaining the master signal at the master latch, and capturing a slave signal dependent on the master signal at a slave latch;

during the first phase of the clock signal, retaining the slave signal at the slave latch, wherein the output signal is dependent on the slave signal; and generating a gated clock signal based on the clock signal and a gating control signal, wherein the gated clock signal is generated with a value dependent on the clock signal when the gating control signal has a first value, and is generated with a fixed value independent of the clock signal when the gating control signal has a second value;

wherein the master-slave flip-flop circuit comprises at least one clocked component controlled by the gated clock signal; and the gating control signal is dependent on the input signal or a signal at a signal node of the master latch, and is independent of the slave signal and the output signal.

Further aspects, features and advantages of the present technique will be apparent from the following detailed description which is to be read in conjunction with the accompanying drawings.

BRIEF DESCRIPTION OF THE DRAWINGS

FIG. 10 provides analysis showing a reduction in power consumption compared to a previous flip-flop topology for the use cases shown in FIG. 9;

DESCRIPTION OF EXAMPLE EMBODIMENTS

Figure 1:
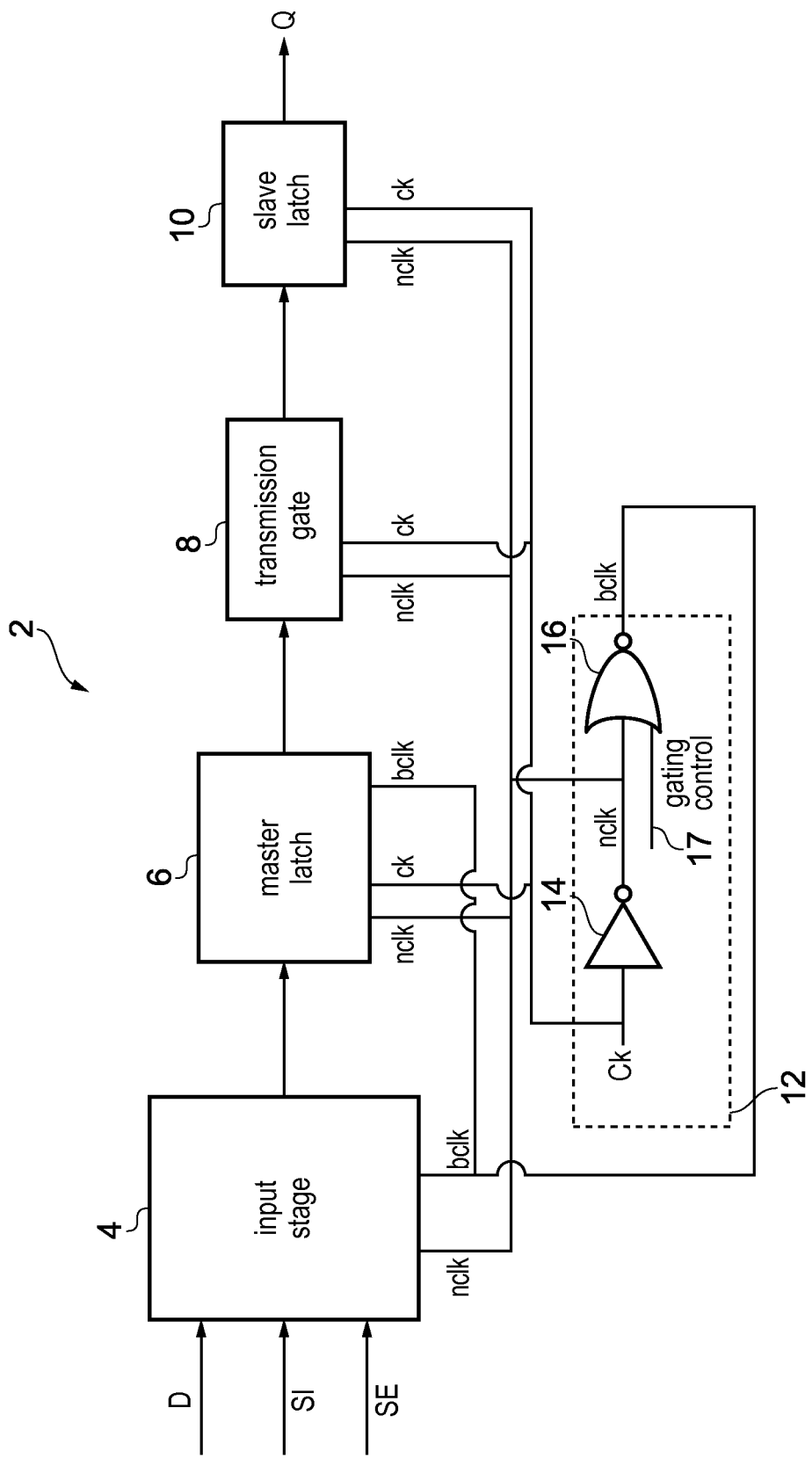
FIG. 1 schematically illustrates a master-slave flip-flop circuit having clock generating circuitry.

FIG. 1 schematically illustrates a master-slave flip-flop circuit 2 for generating an output signal Q in response to an input signal D, SI and a clock signal CK. The flip-flop circuit 2 has an input stage 4, a master latch 6, a transmission gate 8, a slave latch 10, and clock generating circuitry 12 which receives a clock signal CK.

During a first phase of a clock signal CK, the input stage 4 inputs a signal to the master latch 6 which depends on one of a data input signal D and a scan input signal SI (a scan enable signal SE selects which input signal D, SI is used to control the input to the master latch), so that the master latch 6 captures a master signal which depends on the currently selected input signal D, SI. The transmission gate 8 is non-conductive during the first phase, and so the slave latch 10 retains a slave signal from a previous cycle and the output signal Q is held at its previous value.

During a second phase of the clock signal CK, the input stage 4 isolates the master latch 6 from changes in the input signal D, SI, and the master latch 6 retains its master signal. The transmission gate 8 becomes conductive, and the slave latch 10 captures a slave signal which depends on the master signal from the master latch 6. The output signal Q is generated to reflect the new slave signal.

The clock generating circuitry 12 generates clock signals nclk, bclk from the input clock signal CK to control the operation of the input stage 4, master latch 6, transmission gate 8 and slave latch. The clock generating circuitry 12 receives the clock signal CK, which is input to an inverter 14 which inverts the clock signal CK to generate an inverted clock signal nclk. The inverted clock signal nclk is input to a NOR gate 16 where it is combined with a gating control signal 17 using a logical NOR operation. As shall be discussed below, in some examples the gating control signal may be a signal from a first master node nm of the master latch 6. In other examples, the gating control signal may be a signal dependent on the input signal or a signal at a signal node of the master latch, and independent of the slave signal and output signal.

The NOR gate 16 outputs a gated clock signal bclk, which has the following relation to the clock signal CK, the inverted clock signal nclk and the gating control signal 17:

| gating control 17 | CK | nclk | bclk | Power saving on CK path |
|---|---|---|---|---|
| 0 | ↓ | ↑ | ↓ | 0% |
| 1 | ↓ | ↑ | 0 | ~50% |
| 0 | ↑ | ↓ | ↑ | 0% |
| 1 | ↑ | ↓ | 0 | ~50% |

Hence, when the gating control signal 17 has a first value (in this example, logical 0) then the gated clock signal bclk has a value which depends on the clock signal CK and the inverted clock signal nclk. When the gating control signal 17 is 0 then the gated clock signal bclk is an inverted version of the inverted clock signal nclk. On the other hand, when the gating control signal 17 has a second value (in this example, logical 1) then the gated clock signal bclk is tied to a fixed value (logical 0) which is independent of the input clock signal CK and inverted clock signal nclk. This gating achieves around a 50% power saving on the clock path. Some of the components of the master-slave flip-flop circuit 2 are clocked by the gated clock signal bclk, so that when the gating control signal 17 has the second value then power consumption is reduced by preventing toggling of these clocked components while the gated clock signal is held at the fixed value. This reduces dynamic switching power loss.

Figure 2:
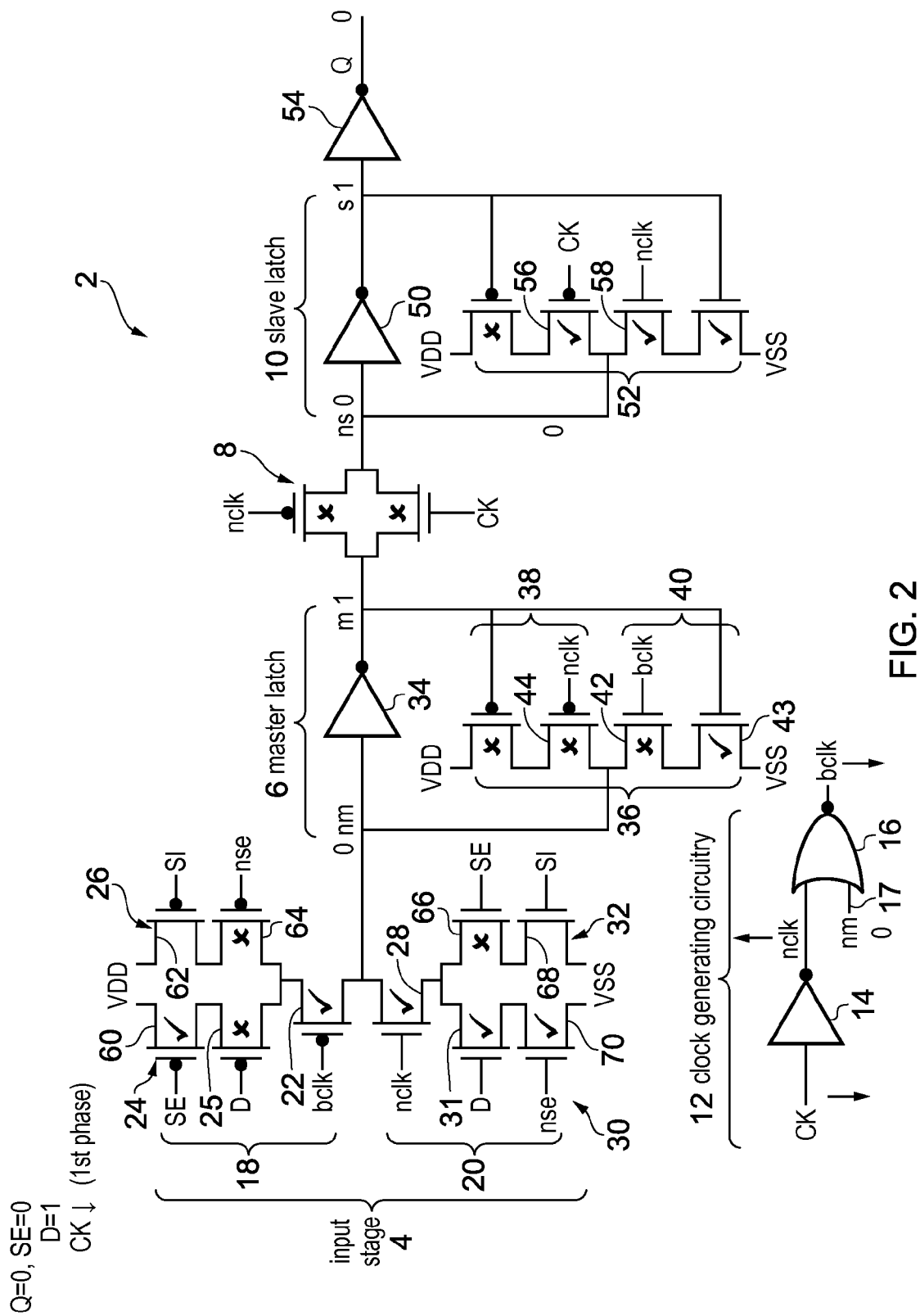
FIGS. 2 to 7 schematically illustrate a first example of the master-slave flip-flop circuit and its operation.

FIG. 2 illustrates a first example circuit arrangement for the master-slave flip-flop shown in FIG. 1. The clock generating circuitry 12 is the same as in FIG. 1. The input stage 4, master latch 6, transmission gate 8 and slave latch 10 are shown in more detail. The input stage 4 inputs a signal dependent on the data input signal D or scan input signal SI to the master latch 6 during a first phase of the clock signal CK and isolates the master latch 6 from changes in the input signal D, SI during a second phase of the clock signal CK. In this example, the first phase of the clock signal is the period between a falling edge and a rising edge of the clock signal CK, while the second phase is the period between the rising edge and the falling edge of the clock signal CK, although other circuits may operate the other way round (e.g. if an additional inventor is included in the clock path).

The input stage 4 comprises a pullup portion 18 for pulling the first master node nm of the master latch 6 to a logical high signal level (VDD or logical 1), and a pulldown portion 20 for pulling the first master node nm of the master latch 6 to a logical low signal (VSS, or logical 0). The pullup portion 18 comprises a clocked transistor 22 which is a p-type transistor and is clocked by the gated clock signal bclk. The pullup portion also comprises two alternative pullup paths 24, 26, with the first pullup path 24 coupled to a data input signal D and the second pullup path 26 coupled to a scan input SI. A scan enable signal SE, and its complementary signal nse having the opposite state to the scan enable signal, are used to select which of the pullup paths 24, 26 is active. When the scan enable signal SE is low, the complementary scan enable signal nse is high, and so the data pullup path 24 is active and the scan pullup path 26 inactive. In this case, then if the data signal D is low then transistor 25 in the first pullup path 24 will turn on, so that when clocked transistor 22 becomes conductive then the first master node nm of the master latch 6 will be brought to VDD (effectively injecting an inverted version of the data signal D into the first master node nm). If the data signal D is high then the transistor 25 will be off and the pullup portion 18 of the input stage 4 will not be conductive. On the other hand, when the scan enable signal SE is high and the complementary scan enable signal nse low, then the scan pullup path 26 is active and the data pullup path 24 inactive. If the scan input signal SI is low then transistor 62 of the scan pullup path 26 will be on and when clocked transistor 22 becomes conductive this will again pull the first master node nm to VDD, and when the scan input signal SI is high then the pullup portion 18 will be non-conductive.

Similarly, the pulldown portion 20 of the input stage 4 has a clocked transistor 28 which is an n-type transistor and is clocked by the inverted clock signal nclk, and two alternative pulldown paths 30, 32 which are coupled to the data input D and the scan input SI respectively and are selected based on the scan enable signal SE and complementary scan enable signal nse in a similar way to the pullup portion 18. With the pulldown portion, the transistors 31, 66 coupled to the data input D and scan input SI respectively will turn on if the data input D or scan input SI is high, and if the corresponding pulldown path 30, 32 is active then this causes the first master node nm to be brought to VSS, again effectively injecting an inverted version of the data input D or scan input SI (whichever is currently selected based on the scan enable signal SE) into the first master node nm The master latch 6 captures a master signal dependent on the input signal during the first phase of the clock signal CK and retains the master signal during the second phase of the clock signal CK. The master latch 6 comprises a first master node nm and a second master node m, and the signal at the second master node m is the master signal in this embodiment and has the same state as the currently selected input signal D, SI. A first inverter 34 inverts the signal at the first master node nm to produce the signal at the second master node m. A second inverter 36 inverts the signal at the second master node m to produce the signal at the first master node nm. The second inverter 36 includes a pullup portion 38 for pulling the signal at the first master node nm to a logical high level when the signal at the second master node m is low and a pulldown portion 40 for pulling the signal at the first master node nm to a logical low signal level when the signal at the second master node m is high. The pulldown portion 40 of the second inverter 36 has a clocked transistor 42 which is clocked by the gated clock signal bclk. The pullup portion 38 has a clocked transistor 44 which is clocked by the inverted clock signal nclk.

The transmission gate 8 comprises a pair of transistors which are controlled to be non-conductive during the first phase of the clock signal, to isolate the slave latch 10 from the master latch 6 so that the slave latch 10 retains a slave signal. During the second phase of the clock signal CK, the transmission gate 8 becomes conductive so that the slave latch 10 captures a slave signal which depends on the master signal in the master latch 6. The slave latch 6 comprises first and second slave nodes, ns, s and in this embodiment the first slave node ns can be regarded as the slave signal. A first inverter 50 inverts the signal at the first slave node ns to produce the signal at the second slave node s while a second inverter 52 inverts the signal at the second slave node s to produce the signal at the first slave node ns. The output signal Q is dependent on the slave signal captured by the slave latch 10 and in this example is produced by inverting the signal at the second slave node s using inverter 54. In other embodiments the output signal Q could be derived from the first slave node ns instead of the second slave node s. In this example, the second inverter 52 of the slave latch 10 has a pullup portion including a clocked transistor 56 which is clocked by the original clock signal CK and a pulldown transistor with a clocked transistor 58 which is clocked by the inverted clock signal nclk.

FIGS. 2 to 7 illustrate the operation of the circuit 2 in response to different values of the input signal D and different phases of the clock signal CK. The scan enable signal SE is set to 0 so that the input signal D is currently selected as the input signal to the flip-flop (transistors 64, 66 are off and transistors 60, 70 are on). In an initial state shown in FIG. 2, the data input D is 1 and the previous output value Q is 0. When the clock signal CK drops low to trigger the first phase of the clock signal, then the inverted clock signal nclk goes high and the gated clock signal bclk goes low. This turns on transistors 22, 28 in the input stage, and as D=1, transistor 31 is conductive and transistor 25 is non-conductive so that the input stage 4 couples the first master node nm to VSS. Hence, the first master node nm is set to 0, and the second master node m is set to 1. The slave latch 10 retains its previous values because the transmission gate 8 is non-conductive and so the output Q remains at 0.

Figure 3:
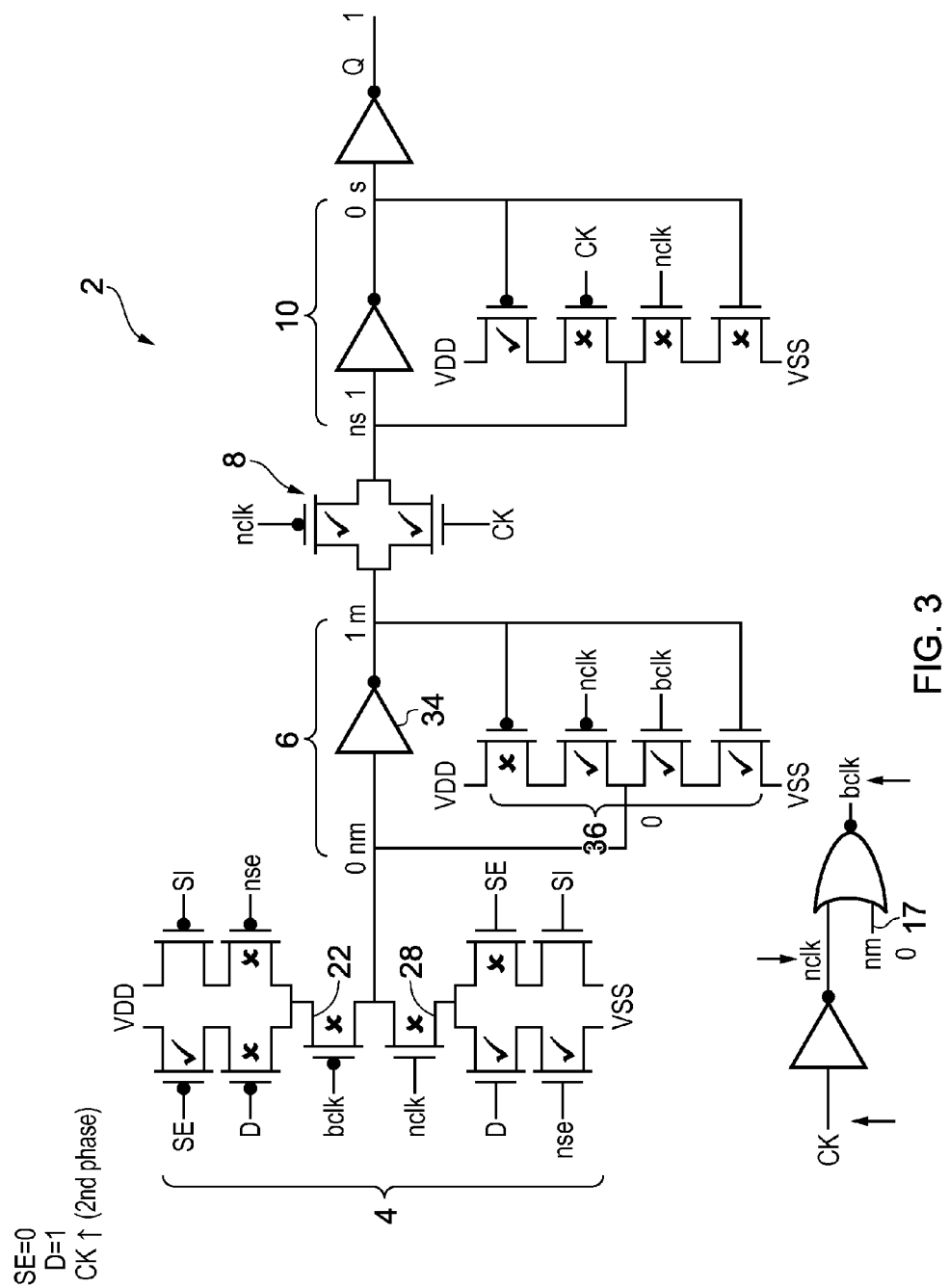

FIG. 3 shows the master flip-flop circuit 2 responding to the second phase of the clock signal triggered by a rising edge of the clock signal CK. The gating control signal nm is still at 0 and so the gated clock signal bclk will be generated with a rising edge in response to a falling edge of the inverted clock signal nclk. This causes transistors 22, 28 in the input stage 4 to switch off to isolate the first master node nm from changes in the data input signal D. The master latch 6 retains its master signal because inverters 34, 36 hold nodes m, nm at their current values. The transmission gate 8 becomes conductive and this causes the slave latch 10 to be coupled to the master latch 6 so that the first slave node ns takes the same value 1 as the second master node m and the second slave node s is set to 0. This causes the output signal Q to be set to 1, and so the output signal Q now reflects the updated input signal D=1.

Figure 4:
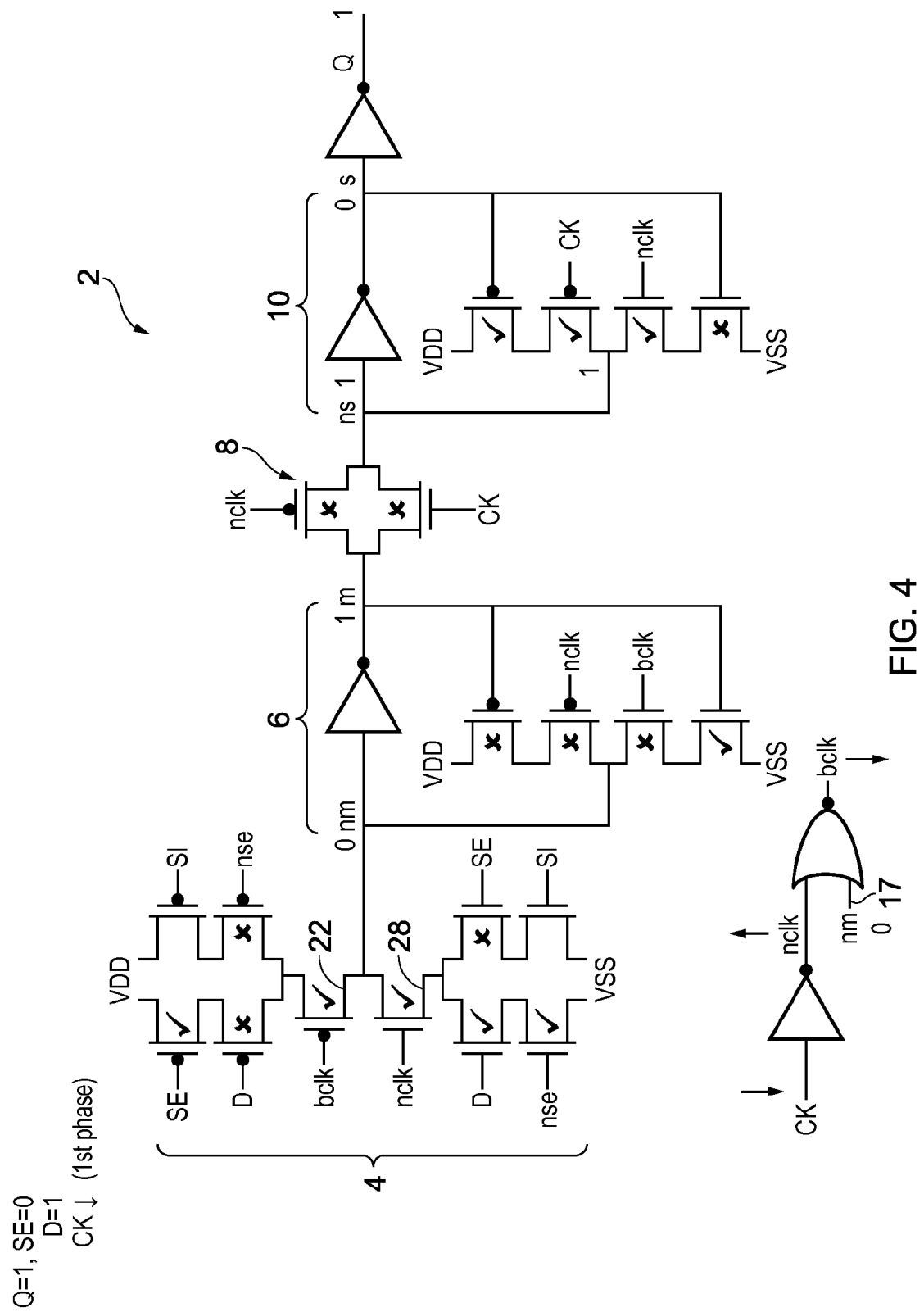

FIG. 4 shows the case where the clock signal CK switches back to the first phase while the data input signal D remains at 1. Hence, transistors 22, 28 of the input stage 4 are turned on again, but this does not change the state of the master latch 6 because the input signal D has remained the same. The slave latch 10 retains its slave signal from the previous second phase of the clock signal as it is once more isolated from the master latch 6 by the non-conductive transmission gate 8. While the data input signal D remains at 1, then the flip-flop 2 switches between the states shown in FIGS. 3 and 4 in response to each cycle of the clock signal CK.

Figure 5:
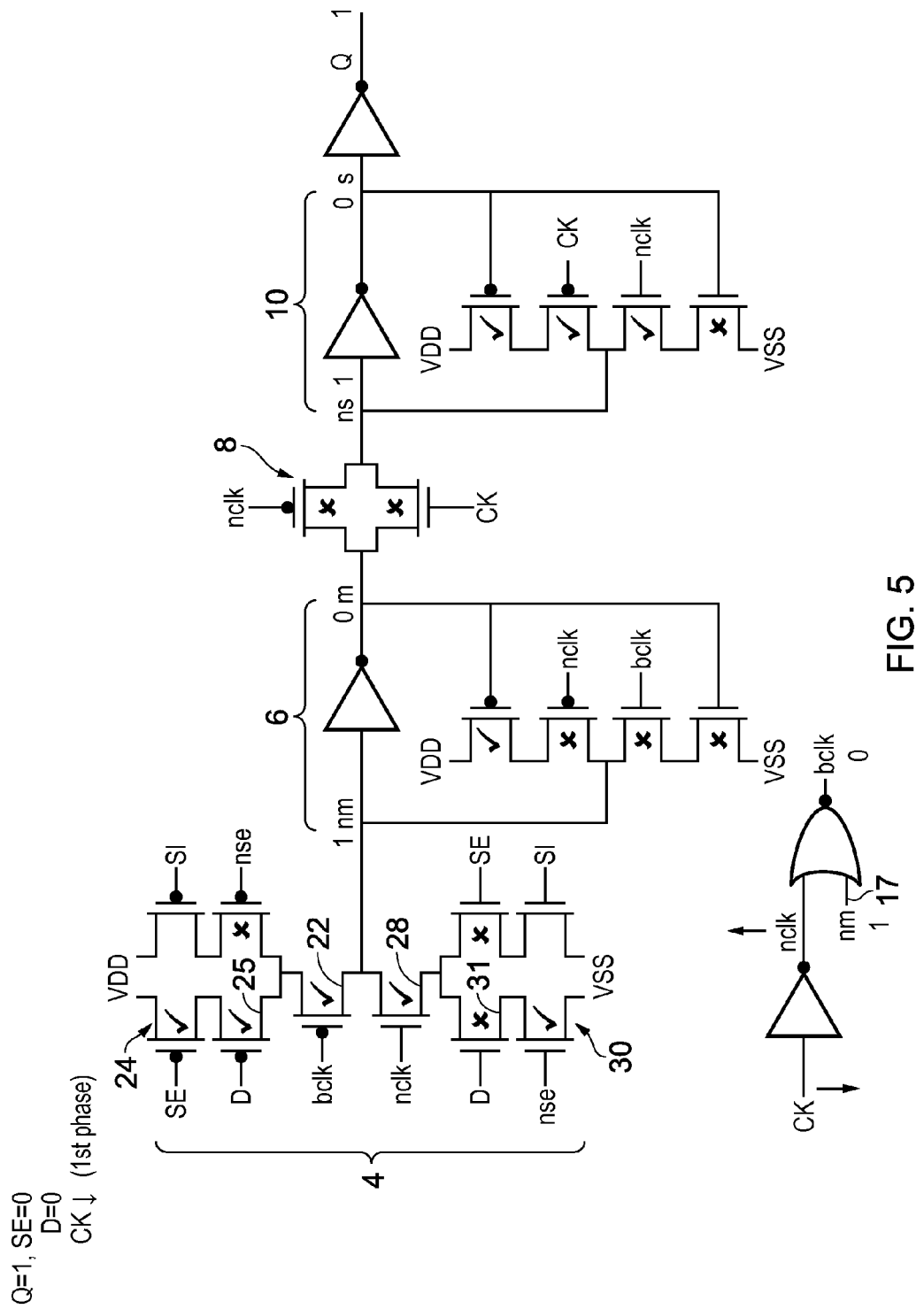

FIG. 5 shows the case where the data input signal D is 0. In the first phase of the clock signal CK, transistors 22, 28 of the input stage 4 turn on. Since the data input signal D is 0 then this time transistor 25 is on and transistor 31 is off, so that the data pullup path 24 pulls the first master node nm of the master latch 6 to logical 1. This means that the gating control signal nm is at the second value and so now the gated clock signal bclk is clamped to a fixed value of 0. The second master node m drops to 0 in response to the first master node nm becoming 1. As the transmission 8 is non-conductive in the first phase of the clock signal CK, then the slave latch 10 and output signal Q remain in the same state as in FIG. 4.

Figure 6:
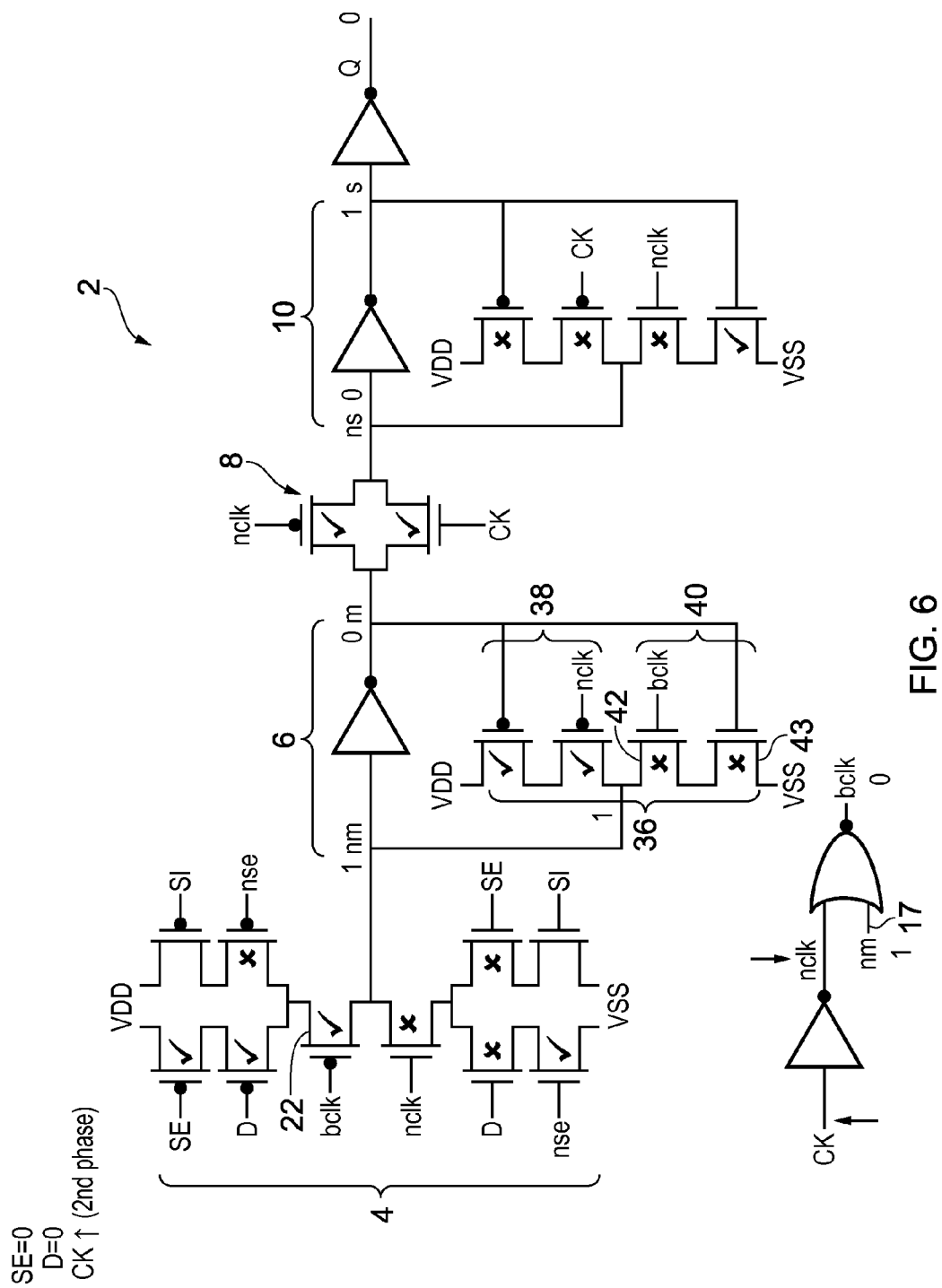

As shown in FIG. 6, during the second phase of a clock signal the rising edge of the clock signal CK causes a falling edge of the clock signal nclk, but because the gating control signal nm is high then this does not cause a corresponding rising edge of the gated clock signal bclk, which is fixed at logical 0. Therefore, unlike in FIG. 3, in FIG. 6 the clocked transistor 22 of the input stage 4 remains on and the clocked transistor 42 of the second inverter 36 in the master latch 6 remains off. This does not affect the correct operation of the master-slave flip-flop circuit 2. Since the first master node nm is at the logical high signal level then it does not matter than transistor 22 in the input stage 4 has remained on, because this merely reinforces the effect of the pullup portion 38 of the second inverter 36 of the master latch 6. Similarly, it is not a problem that transistor 42 in a second inverter 36 remains off, because the second master node m is at logical 0 and so the pulldown portion 40 of the second inverter 36 is inactive anyway (transistor 43 is off). Therefore, by gating the gated clock signal bclk, transistors 22, 42 can be prevented from toggling on and off between FIGS. 5 and 6 or between FIGS. 6 and 7, so that dynamic switching power is reduced. As shown in FIG. 6, during the second phase of the clock signal the transmission gate 8 becomes conductive to couple the master latch 6 to the slave latch 10 and now the slave latch 10 will switch states based on the signal at the master latch 6, causing the output signal Q to drop to 0.

Figure 7:
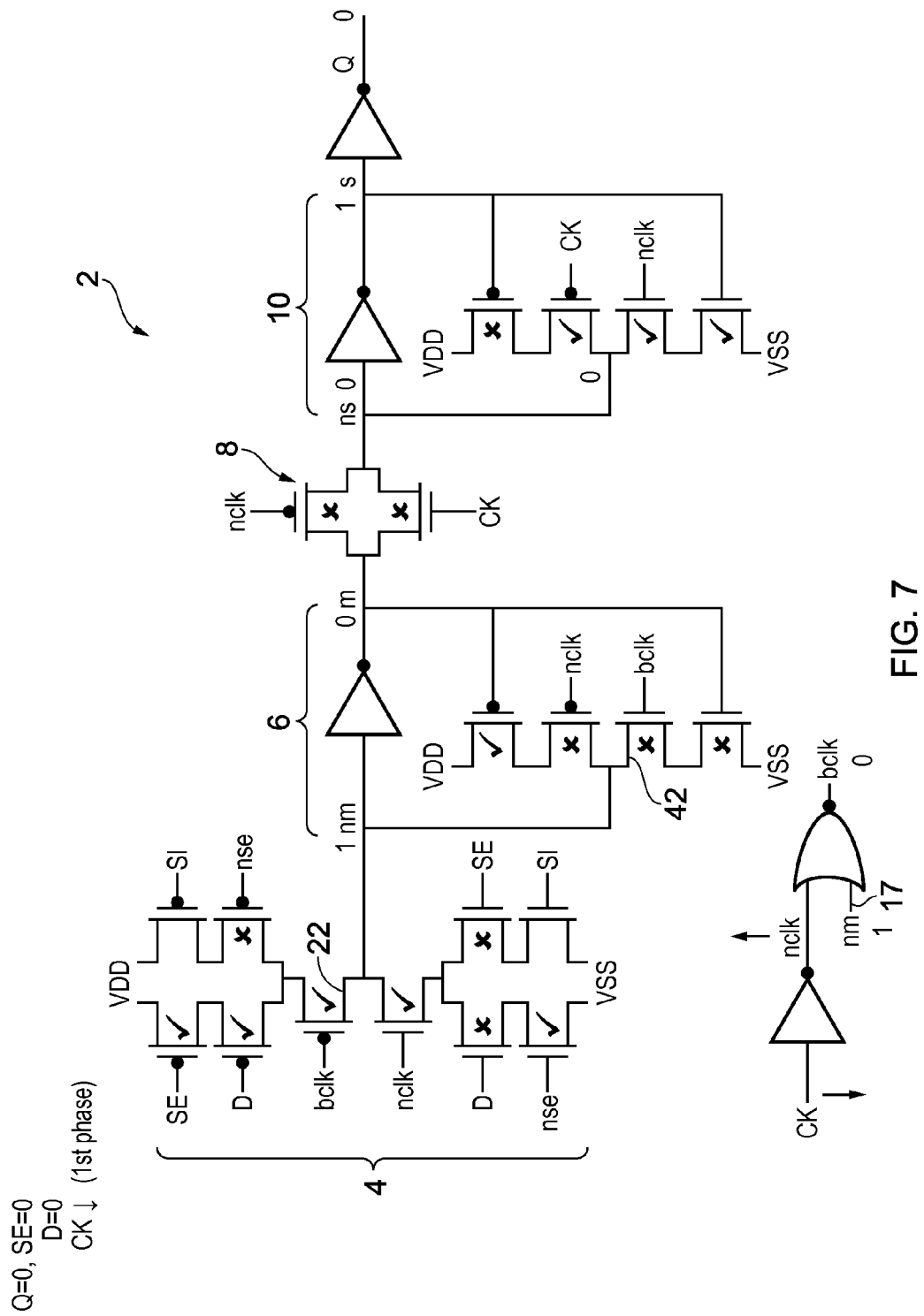

As shown in FIG. 7, when the clock signal returns to the first phase then transistors 22, 42 remain on and off respectively and the master signal m, slave signal ns and output signal Q remain at the same values as in FIG. 6 because input signal D has not changed. As long as the data input signal D remains at 0 then the flip-flop circuit 2 will switch between the states shown in FIGS. 6 and 7 in response to the clock signal CK.

While FIGS. 2 to 7 show the flip-flop circuit 2 responding to the data input signal D, if the scan enable signal SE was 1 then the flip-flop circuit 2 would instead respond to the scan input signal SI. Otherwise, the operation of the flip-flop circuit would be the same as shown in FIGS. 2 to 7. The provision of a scan input signal SI and scan enable signal SE is optional. In other embodiments only a data input signal D may be provided, in which case transistors 60, 62, 64, 66, 68, 70 of the input stage 4 may be omitted.

The master-slave flip-flop circuit may implemented using different types of transistors, such as BJTs (bipolar junction transistors), FETs (field effect transistors), CMOS (complementary metal-oxide semiconductor transistors), FinFETs or nanoFETs, for example.

In summary, the present technique recognises that there are some components of a master-slave flip-flop circuit 2 which can be held at a fixed state during the period when the data input signal D is 0 and the first master node nm is at 1, without affecting the correct operation of the master-slave flip-flop circuit 2. By clocking these transistors 22, 42 using the gated clock signal bclk, power consumption can be reduced. Also, the clock generating circuitry 12 has a simpler configuration than some previous examples where the input signal D and output signal Q are combined in an exclusive or (XOR) operation, which requires more combinational logic than the case shown in FIGS. 2 to 7 in which the gating control is simply a signal from the master latch 6. In other examples, the gating control signal may be any signal which depends on the input signal D, SI or a signal at a signal node of the master latch 6, and which is independent of the slave signal of the slave latch 10 and the output signal Q.

Figure 8:
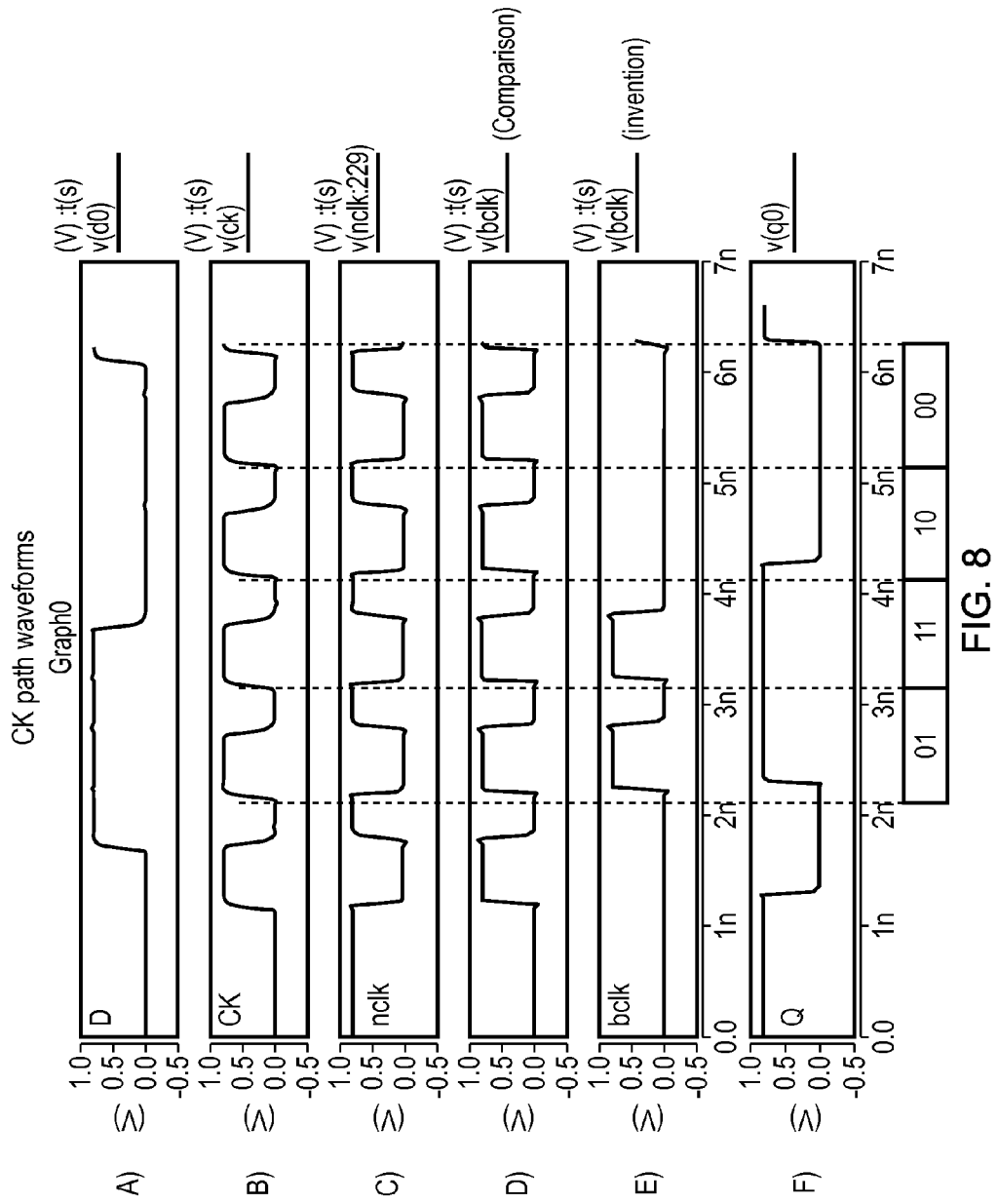
FIG. 8 is a timing diagram showing signals within the master-slave flip-flop circuit.

FIG. 8 is a timing diagram showing clock path waveforms for the circuit shown in FIGS. 2 to 7. Part A of FIG. 8 shows the data input signal D. Part B shows the clock signal CK. Part C shows the inverted clock signal nclk, which is an inverted version of the clock signal in part B. Part D of FIG. 8 does not show the present technique, but shows for comparison an example where the gated clock signal bclk is generated using an inverter instead of a NOR gate as shown in FIGS. 2 to 7. In this case, the gated clock signal bclk would simply be an inverted version of the inverted clock signal nclk and the power savings of the present technique would not be achieved. Part E of FIG. 8 shows the gated clock signal bclk of the present technique. When the data input D is 0, then the first master node nm is 1, and the gated clock signal bclk is clamped to 0. Part F of FIG. 8 shows the output signal varying in response to the clock signal and the input signal D. The output signal Q still has the correct behaviour regardless of the gating of the gated clock signal bclk.

Figure 9:
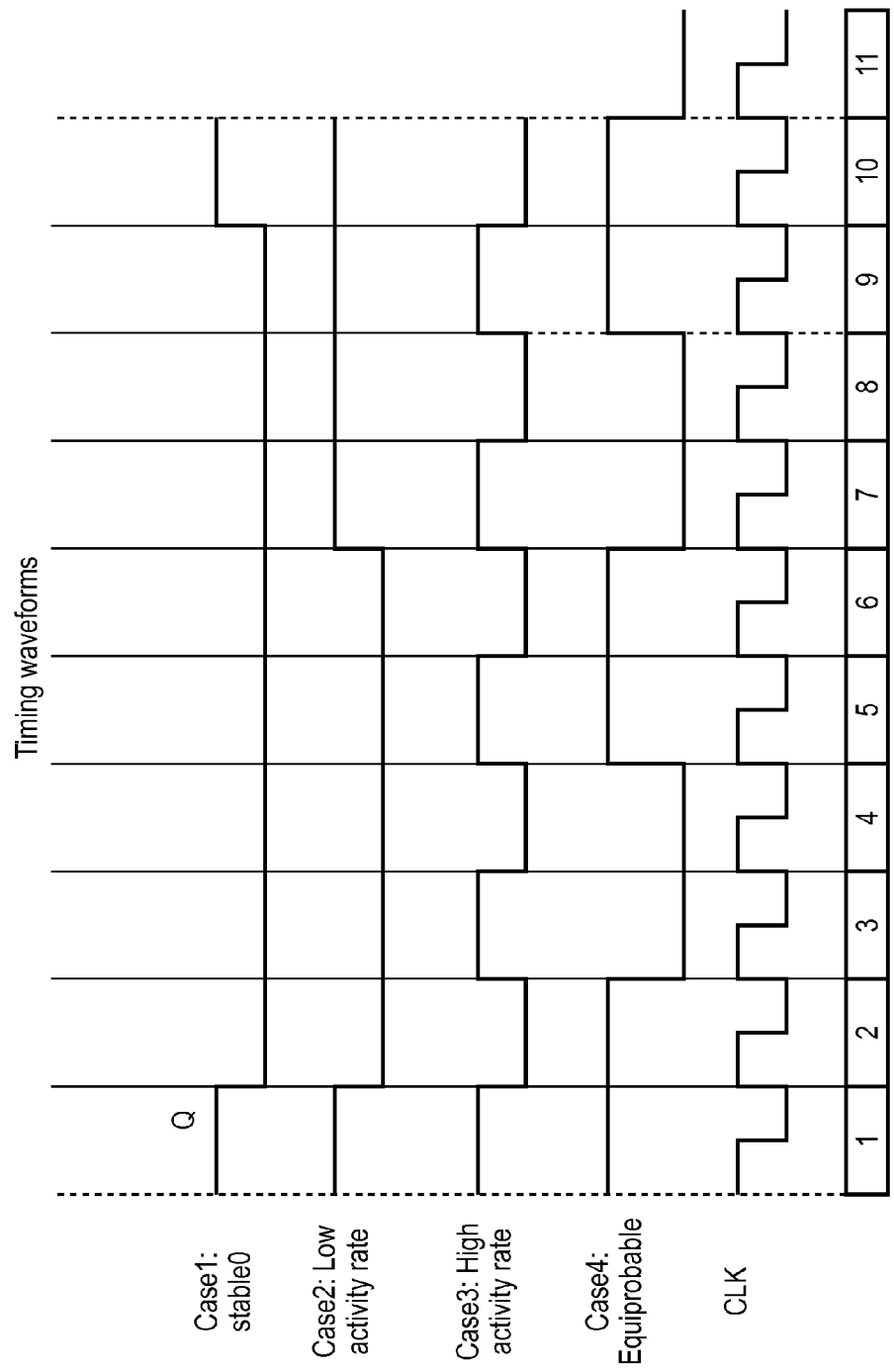
FIG. 9 is a timing diagram showing example use cases of the flip-flop circuit.

FIG. 9 shows some example use cases of a present technique. FIG. 10 shows a power comparison analysis of the power savings achieved by the present technique in each use case. Since the gated clock bclk is gated only during the period when nm=1 (i.e. the input signal D, SI and output signal Q are 0), then the amount of power saving achieved using the present technique depends on the amount of time at which the flip-flop output signal Q remains at 0 or 1. That is, FIG. 8 shows the four possible transitions of the output signal Q which can occur in response to the second phase of the clock signal CK (rising edge):

01: the output signal Q is initially at 0 and then changes to 1 in response to the rising edge of the clock signal CK (the transition shown between FIGS. 2 and 3);

11: the output signal Q is initially at 1 and then following a rising edge of the clock signal CK remains at 1 (the transition between FIG. 4 and FIG. 3);

10: the output signal Q is initially at 1 and then switches to 0 in response to the rising edge of the clock signal CK (the transition between FIG. 5 and FIG. 6);

00: the output signal Q is initially at 0 and then remains at 0 following a rising edge of the clock signal CK (the transition between FIG. 7 and FIG. 6).

The four use cases shown in FIG. 8 have different probabilities of occurrence of these four states 01, 11, 10, 00, as shown in the table at the bottom of FIG. 9:

Case 1: the output signal Q remains stable at logical 0, with only short periods of logical 1, so that the probability of the 00 transition is much higher than the probability of 01, 10, 11.

Case 2: Q=1 and Q=0 are equally likely, but there is a relatively low activity rate, and so the probability of the 00 and 11 transitions is higher than the probability of the 01, 10 transitions (the output signal Q is more likely to remain the same in a given cycle than to switch states).

Case 3: Q=1 and Q=0 are equally likely, but there is a relatively high activity rate, with the output signal Q switching relatively rapidly between high and low signal levels, so that the probability of the 01, 10 transitions in which Q switches states is higher than the probability of the 00, 11 transitions in which Q remains constant.

Case 4: each of the four transitions 01, 10, 00, 11 have equal probability.

FIG. 10 shows a power comparison between an existing topology and the new topology shown in FIGS. 2 to 7 for each of these cases shown in FIG. 9. The table in the top part of FIG. 10 shows the difference in power consumption for each of the states 00, 01, 10, 11. The power consumption is reduced during the 00 and 10 transitions, because this is when the clock gating takes place (the gating control signal nm=1). During the 01 and 11 states there is a slight increase in power consumption due to the addition of the NOR gate 16 in the clock generating circuitry 12, with no reduction in power saving because there is no clock gating when nm=0.

As shown in the bottom part of FIG. 9, for the four use cases 1 to 4 there is a reduction in power consumption because the flip-flop 2 is in the 10 or 00 states for a significant amount of time. Hence, the flip-flop of the present technique can achieve a useful reduction in power consumption.

Figure 11:
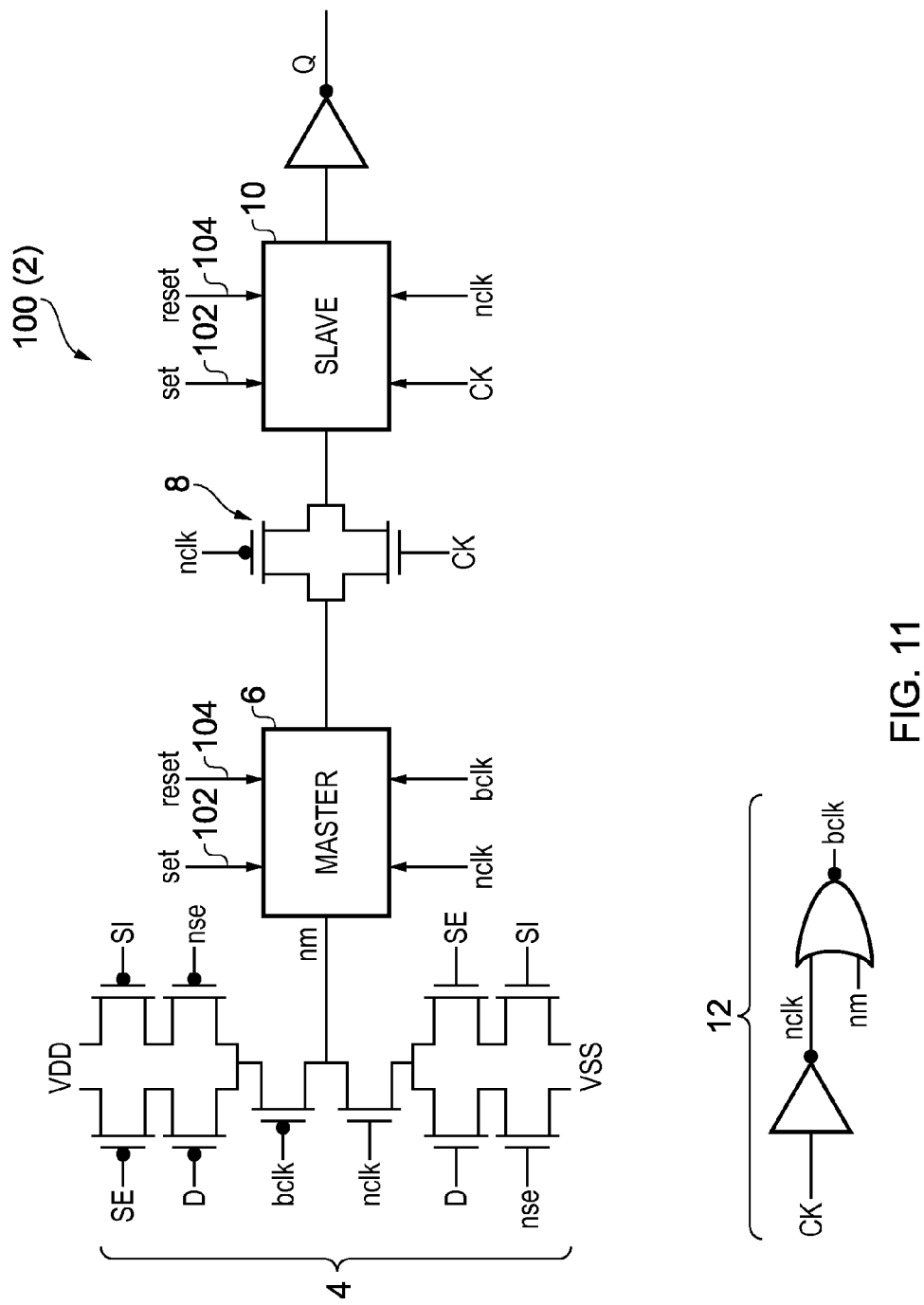
FIG. 11 shows a second example of a master-slave flip-flop circuit in which set and reset signals are provided to the master latch and slave latch.

FIG. 11 shows another example implementation 100 of the master-slave flip-flop circuit 2 of FIG. 1. In this example, the input stage 4, clock generating circuitry 12 and transmission gate 8 are the same as in FIG. 2. However, unlike in FIGS. 2 to 7, the master latch 6 and slave latch 10 receive a set signal 102 and a reset signal 104. In response to the set signal 102 being asserted, the master latch 6 sets the master signal m to 1 and the slave latch sets the slave signal ns to 1. For example, this can be achieved by providing some additional transistors coupling nodes m, ns to the VDD rail, with the set signal provided to the gate of these transistors. In response to the reset signal 4, the master latch 6 resets the master signal m to 0 and the slave latch 10 resets the slave signal ns to 0, which can similarly be achieved with additional transistors coupling these nodes to ground (VSS). Otherwise, the operation of the master latch 6 and slave latch 10 are as shown in FIGS. 2 to 7. In some embodiments, only one of the set and reset signals 102, 104 may be provided.

Figure 12:
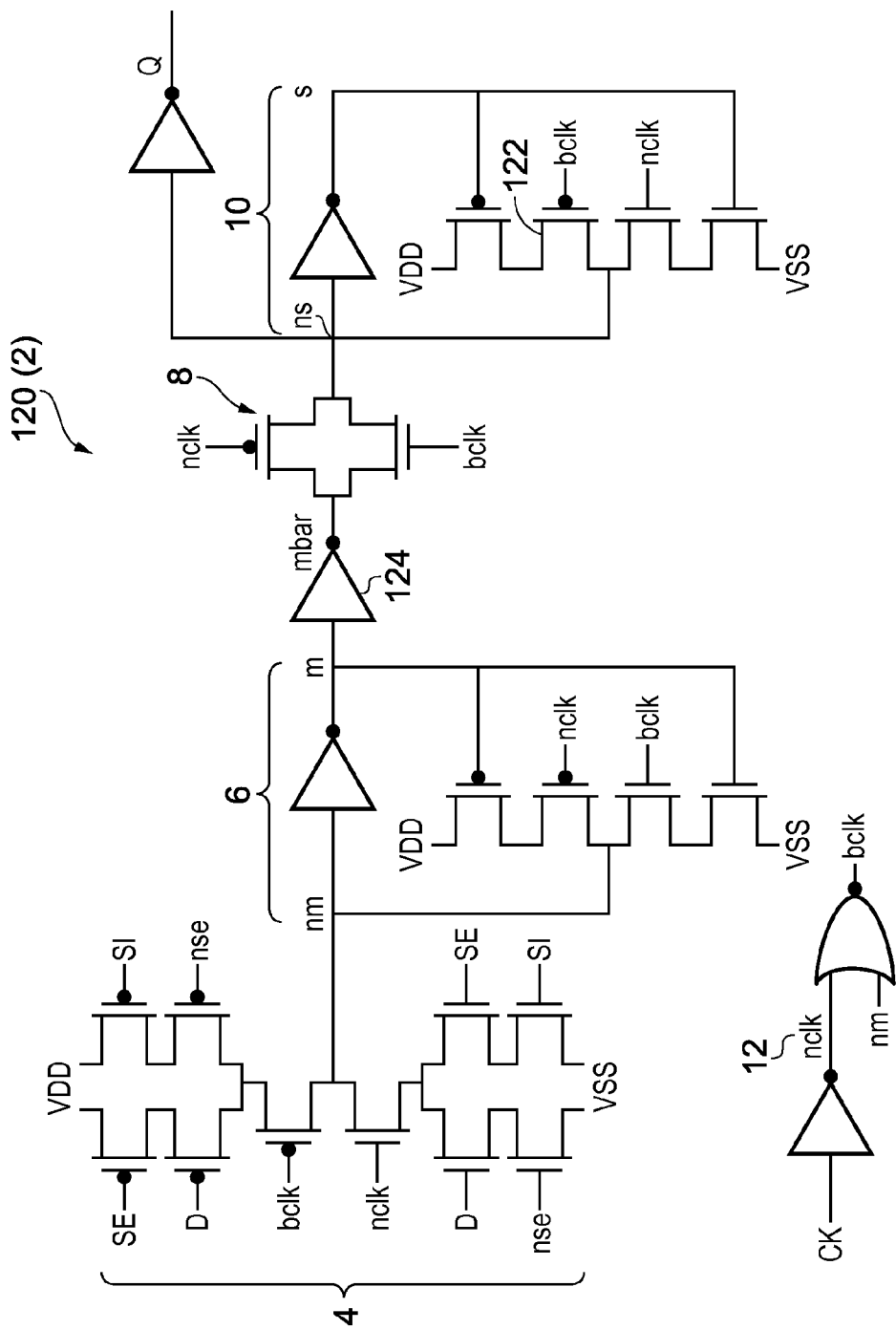
FIG. 12 shows a third example of a master-slave flip-flop circuit in which a transistor of the slave latch is also clocked by the clock signal.

FIG. 12 shows a third example 120 of the master-slave flip-flop circuit 2 of FIG. 1. Again, the input stage 4, transmission gate 8 and clock generating circuitry 12 are the same as in FIGS. 2 to 7. The master latch 6 is also the same as in FIGS. 2 to 7. However, FIG. 12 differs from FIGS. 2 to 7 in that the slave latch 10 includes a clocked transistor 122 which is clocked by the gated clock signal bclk. This provides a further power saving compared to the previous embodiment. Also, FIG. 12 differs from FIG. 2 in that an additional inverter 124 is provided between the master latch 6 and the slave latch 10 and so in this case the first slave node ns of the slave latch 10 carries an inverted version of the master signal. In this case, the slave signal can be regarded as the signal at the second master node s. In this example, the output signal Q is tapped from the first slave node ns instead of the second slave node s, so that there is still the same relation between the input signal D, SI and the output signal Q. The inclusion of the inverter 124 and the change to the generation of the output signal Q in FIG. 12 could also be applied to FIG. 2.

While FIG. 12 shows an example where the signal at the first master node nm is used as a gating control signal, in another example the signal mbar at the output of the inverter 124 could be used as the gating control signal. Alternatively, any other signal which is dependent on the input signal D, SI or the first master node nm and which changes in phase with the first master node nm (i.e. a non-inverted version of the first master node nm) could be used as the gating control signal which is input to the NOR gate 16.

Figure 13:
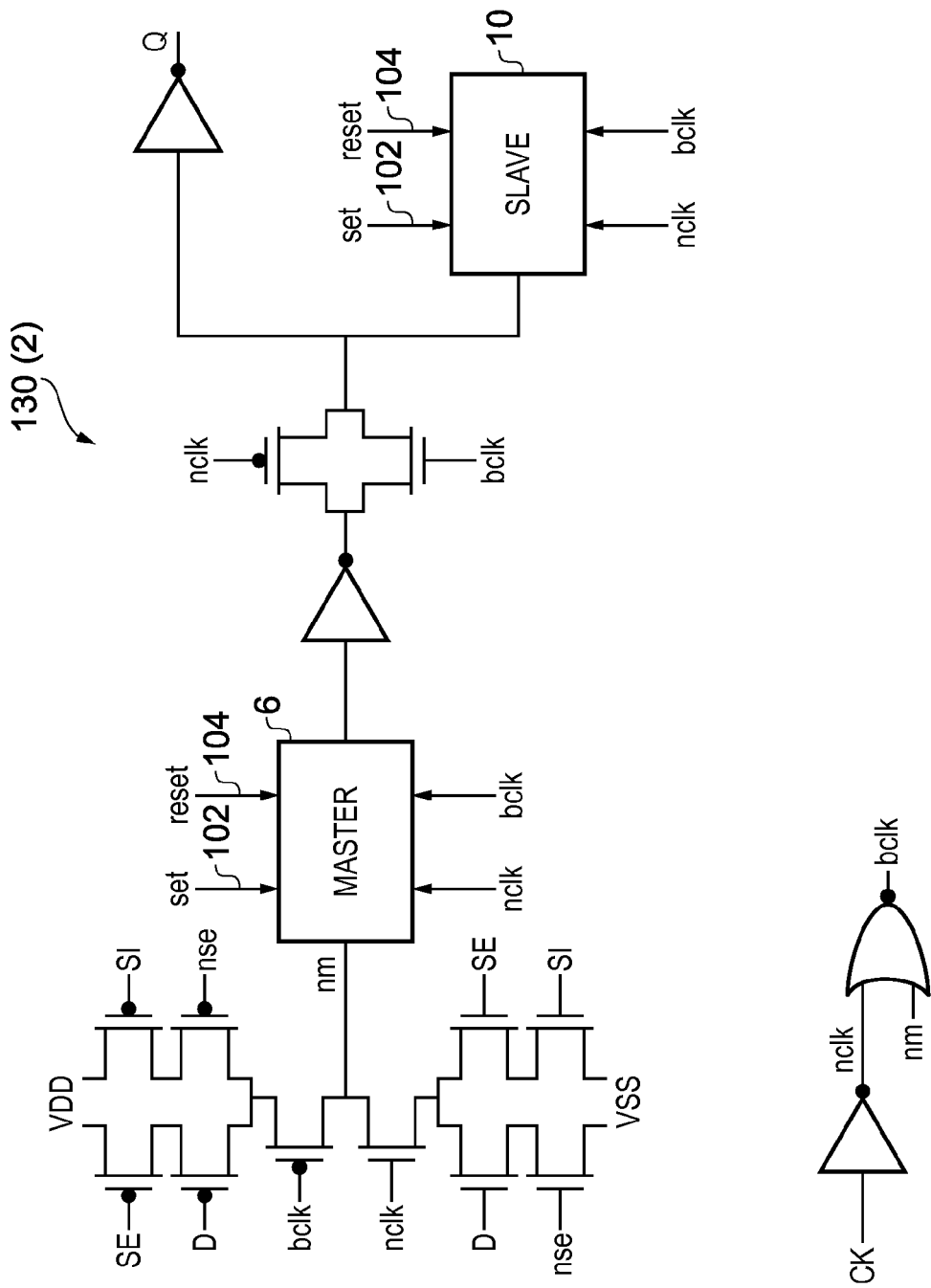
FIG. 13 shows a fourth example of a master-slave flip-flop circuit in which the master and slave latches receive set and reset signals and both the master and slave latches are clocked by the gated clock signal.

FIG. 13 shows a fourth example 130 of the master-slave flip-flop circuit 2 of FIG. 1. FIG. 13 is similar to FIG. 12, except that the master latch 6 and slave latch 10 receives set and reset signals 102, 104 in a similar way to FIG. 11. Unlike in FIG. 11, in the example of FIG. 13 the slave latch 10 receives the gated clock signal bclk (similar to FIG. 11).

Figure 14:
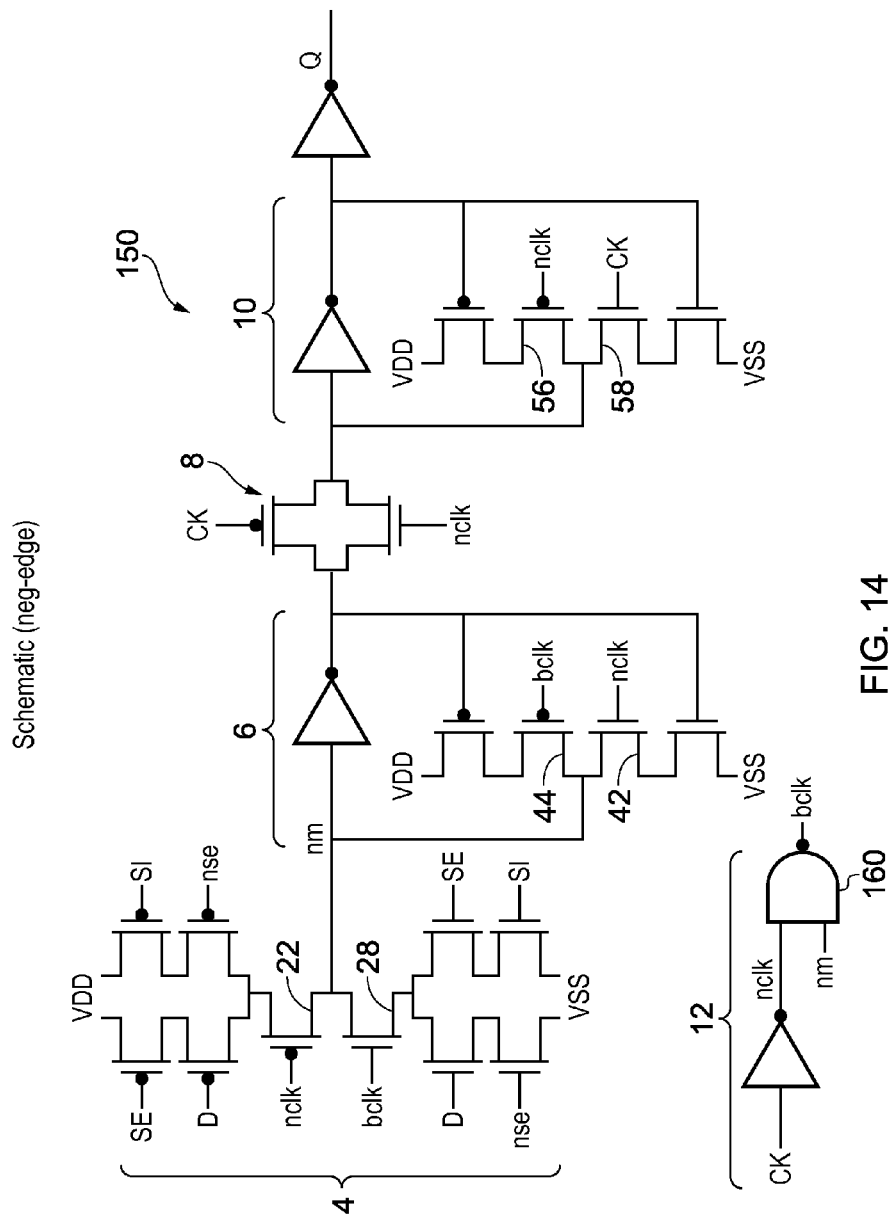
FIG. 14 illustrates a fifth example of a master-slave flip-flop circuit in which the flip-flop is triggered by negative edges of the clock signal.

The examples shown in FIGS. 1 to 13 are positive-edge triggered so that it is the rising edge of the clock signal CK that triggers events within the flip-flop. However, it is also possible to provide a negative-edge triggered embodiment, such as the example shown in FIG. 14. FIG. 14 is the same as FIG. 2, except that the NOR gate 16 of FIG. 2 is replaced with a NAND gate 160, and each pair of clocked transistors is coupled to the opposite clock signal compared to FIG. 2:

in the input stage 4, inverted clock nclk is provided to transistor 22 and gated clock signal to transistor 28, rather than the other way round in FIG. 2;

in the master latch 6, gated clock bclk is provided to transistor 44 and inverted clock nclk is provided to transistor 42;

in transmission gate 8, the transistors are coupled to the input clock CK and the inverted clock signal nclk the opposite way round to FIG. 2;

in the slave latch 10, input clock signal CK is provided to transistor 58 and inverted clock signal nclk provided to transistor 56.

A similar modification could be made to the examples of FIGS. 11 to 13 to produce corresponding negative-edge triggered flip-flops.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A master-slave flip-flop circuit for generating an output signal in response to an input signal and a clock signal, the master-slave flip-flop circuit comprising:
    a master latch configured to capture a master signal dependent on the input signal during a first phase of the clock signal and to retain the master signal during a second phase of the clock signal;
    a slave latch configured to capture a slave signal dependent on the master signal during the second phase of the clock signal and to retain the slave signal during the first phase of the clock signal, wherein the output signal is dependent on the slave signal; and
    clock generating circuitry configured to:
        invert the clock signal to generate an inverted clock signal; and
        generate a gated clock signal based on the clock signal and a gating control signal,
        wherein the clock generating circuitry comprises a logic gate configured to receive the inverted clock signal and the gating control signal as inputs and to output the gated clock signal;
    at least one clocked component controlled by the gated clock signal; and
    at least one clocked component controlled by the inverted clock signal,
    wherein the clock generating circuitry is further configured to generate the gated clock signal with a value dependent on the clock signal when the gating control signal has a first value, and to generate the gated clock signal with a fixed value independent of the clock signal when the gating control signal has a second value, and
    wherein the gating control signal is dependent on the input signal or a signal at a signal node of the master latch, and is independent of the slave signal and the output signal.

2. The master-slave flip-flop circuit according to claim 1, wherein the gating control signal comprises the input signal or the signal at the signal node of the master latch.

3. The master-slave flip-flop circuit according to claim 1, wherein the clock generating circuitry is further configured to generate the gated clock signal based on the inverted clock signal and the gating control signal.

4. The master-slave flip-flop circuit according to claim 1, wherein the logic gate comprises a NOR gate.

5. The master-slave flip-flop circuit according to claim 1, wherein the master latch comprises a first master node coupled to an input stage for inputting a signal having a value dependent on the input signal, and a second master node coupled to the slave stage.

6. The master-slave flip-flop circuit according to claim 5, wherein the gating control signal comprises the signal at the first master node of the master latch.

7. The master-slave flip-flop circuit according to claim 6, wherein said first value of the gating control signal comprises a logical low signal level of the signal at the first master node, and said second value of the gating control signal comprises a logical high signal level of the signal at the first master node.

8. The master-slave flip-flop circuit according to claim 5, wherein the master latch comprises a first inverter coupled between the first master node and the second master node, and a second inverter coupled between the second master node and the first master node; and
said at least one clocked component controlled by the gated clock signal comprises a transistor of the second inverter.

9. The master-slave flip-flop circuit according to claim 8, wherein the second inverter comprises a pullup portion for pulling the signal at the first master node to a logical high signal level and a pulldown portion for pulling the signal at the first master node to a logical low signal level;
wherein said at least one clocked component controlled by the gated clock signal comprises a transistor of the pulldown portion of the second inverter.

10. The master-slave flip-flop circuit according to claim 1, comprising an input stage configured to input a first signal to a first master node of the master latch during the first phase of the clock signal, the first signal having a value dependent on the input signal, and to isolate the first master node of the master latch from changes in the input signal during the second phase of the clock signal.

11. The master-slave flip-flop circuit according to claim 10, wherein said at least one clocked component controlled by the gated clock signal comprises a transistor of the input stage.

12. The master-slave flip-flop circuit according to claim 11, wherein the input stage comprises a pullup portion for pulling the signal at the first master node to a logical high signal level and a pulldown portion for pulling the signal at the first master node to a logical low signal level;
wherein said at least one clocked component controlled by the gated clock signal comprises a transistor of the pullup portion of the input stage.

13. The master-slave flip-flop circuit according to claim 10, wherein the input stage is configured to receive a data input signal, a scan input signal and a scan enable signal; and
the input stage is configured to select the data input signal as said input signal if the scan enable signal has a first value, and to select the scan input signal as said input signal if the scan enable signal has a second value.

14. The master-slave flip-flop circuit according to claim 1, wherein said at least one clocked component controlled by the inverted clock signal comprises a transistor of the slave latch.

15. The master-slave flip-flop circuit according to claim 1, wherein the input signal comprises a data input signal.

16. The master-slave flip-flop circuit according to claim 1, wherein the input signal comprises one of a data input signal and a scan input signal.

17. The master-slave flip-flop circuit according to claim 1, wherein the master latch is configured to set the master signal to a first predetermined value in response to a set signal, and the slave latch is configured to set the slave signal to a second predetermined value in response to the set signal.

18. The master-slave flip-flop circuit according to claim 1, wherein the master latch is configured to reset the master signal to a third predetermined value in response to a reset signal, and the slave latch is configured to reset the slave signal to a fourth predetermined value in response to the reset signal.

19. A master-slave flip-flop circuit for generating an output signal in response to an input signal and a clock signal, the master-slave flip-flop circuit comprising:
master latch means for capturing a master signal dependent on the input signal during a first phase of the clock signal and for retaining the master signal during a second phase of the clock signal;
slave latch means for capturing a slave signal dependent on the master signal during the second phase of the clock signal and for retaining the slave signal during the first phase of the clock signal, wherein the output signal is dependent on the slave signal; and
clock generating means for:
inverting the clock signal to generate an inverted clock signal; and
generating a gated clock signal based on the clock signal and a gating control signal,
wherein the clock generating means comprises a logic gate configured to receive the inverted clock signal and the gating control signal as inputs and to output the gated clock signal;
at least one clocked component means being controlled by the gated clock signal; and
at least one clocked component means being controlled by the inverted clock signal,
wherein the clock generating means is further configured to generate the gated clock signal with a value dependent on the clock signal when the gating control signal has a first value, and to generate the gated clock signal with a fixed value independent of the clock signal when the gating control signal has a second value, and
wherein the gating control signal is dependent on the input signal or a signal at a signal node of the master latch means, and is independent of the slave signal and the output signal.

20. A method of operating a master-slave flip-flop circuit for generating an output signal in response to an input signal and a clock signal, the method comprising:
during a first phase of the clock signal, capturing a master signal dependent on the input signal at a master latch;
during a second phase of the clock signal, retaining the master signal at the master latch, and capturing a slave signal dependent on the master signal at a slave latch;
during the first phase of the clock signal, retaining the slave signal at the slave latch, wherein the output signal is dependent on the slave signal; and
generating an inverted clock signal based on the clock signal;
receiving, at a logic gate of a clock generating circuitry, the inverted clock signal and a gating control signal as inputs;
generating a gated clock signal based on the clock signal and the gating control signal, wherein the gated clock signal is generated with a value dependent on the clock signal when the gating control signal has a first value, and is generated with a fixed value independent of the clock signal when the gating control signal has a second value, wherein the master-slave flip-flop circuit comprises at least one clocked component controlled by the gated clock signal and at least one clocked component controlled by the inverted clock signal, wherein the gating control signal is dependent on the input signal or a signal at a signal node of the master latch, and is independent of the slave signal and the output signal; and outputting the gated clock signal from the clock generating circuitry.

* * * * *